(12) United States Patent
Takenaka et al.

(10) Patent No.: US 7,732,776 B2
(45) Date of Patent: Jun. 8, 2010

(54) RADIATION IMAGING APPARATUS, DRIVE METHOD AND PROGRAM OF THE RADIATION IMAGING APPARATUS

(75) Inventors: Katsuro Takenaka, Honjo (JP); Tadao Endo, Honjo (JP); Toshio Kameshima, Kumagaya (JP); Tomoyuki Yagi, Honjo (JP); Keigo Yokoyama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 12/247,491

(22) Filed: Oct. 8, 2008

(65) Prior Publication Data

US 2009/0121143 A1 May 14, 2009

(30) Foreign Application Priority Data

Nov. 12, 2007 (JP) ............................. 2007-293522

(51) Int. Cl.
G01T 1/20 (2006.01)
(52) U.S. Cl. ...................................... 250/369
(58) Field of Classification Search ................. 250/369, 250/370.01, 370.08, 370.09
See application file for complete search history.

(56) References Cited

U.S. PATENT DOCUMENTS 6,163,029 A   12/2000   Yamada et al. .......... 250/370.09
2006/0065944 A1*   3/2006   Mochizuki et al. .......... 257/444
2007/0125952 A1*   6/2007   Endo et al. .................. 250/369

* cited by examiner

Primary Examiner—David P Porta
Assistant Examiner—Marcus H Taningco
(74) Attorney, Agent, or Firm—Fitzpatrick, Cella, Harper & Scinto

(57) ABSTRACT

Provided is a radiation imaging apparatus including: a conversion unit including a plurality of pixels arranged two-dimensionally, wherein each of the pixels includes a conversion element for converting incident radiation into an electric charge and a switching element for transferring an electric signal based on the electric charge; a drive circuit unit for outputting, to the switching element, a drive signal having a voltage for turning on the switching element; a read-out circuit unit for reading out the electric signal from the pixel; a calculating unit for calculating the S/N ratio of the electric signal read out by the read-out circuit unit; and a determination unit capable of changing the voltage of the drive signal output from the drive circuit unit according to the S/N ratio calculated. As a result, the radiation imaging apparatus capable of improving the S/N ratio of the derived image is provided.

11 Claims, 7 Drawing Sheets

$$N_{ALL} = \sqrt{N_X^2 + N_{SENS}^2 + N_{TFT}^2 + N_{AMP}^2 + N_{AD}^2}$$

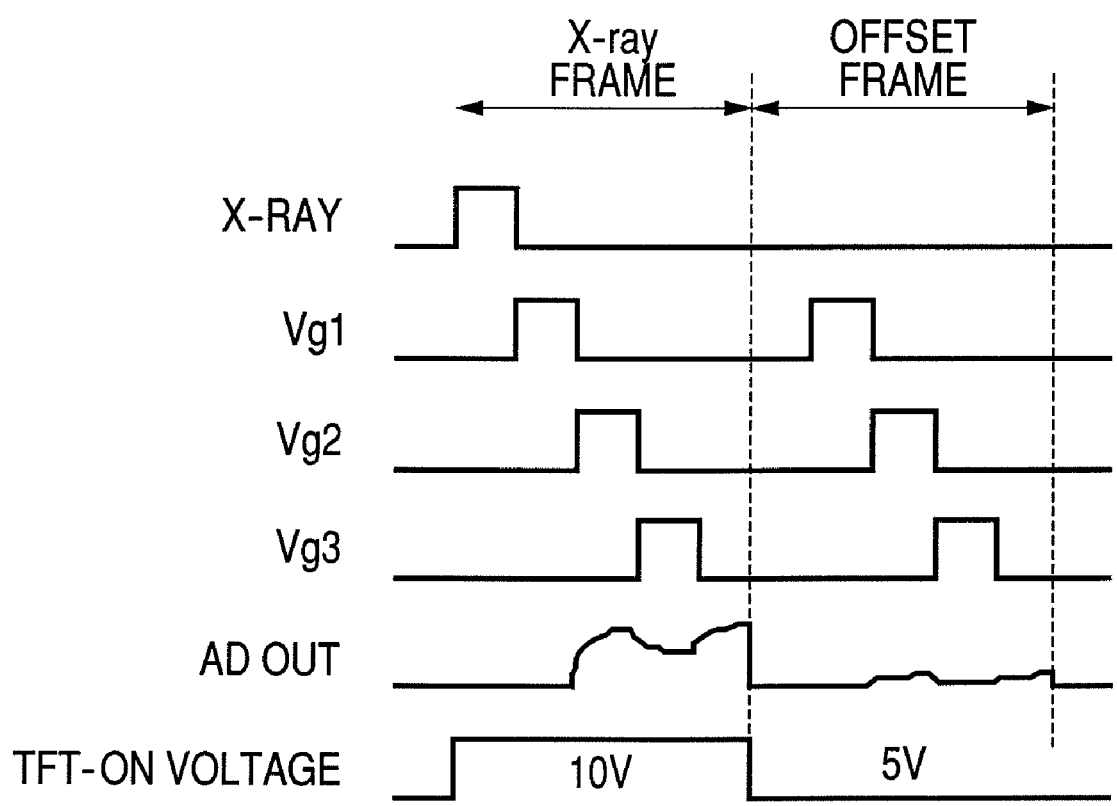

RADIATION IMAGING APPARATUS, DRIVE METHOD AND PROGRAM OF THE RADIATION IMAGING APPARATUS

BACKGROUND OF THE INVENTION

1. Field of the Invention

The present invention relates to a radiation imaging apparatus, a drive method therefore and a program of the radiation imaging apparatus.

2. Description of the Related Art

In recent years, a planar radiation imaging apparatus using semiconductor manufacturing technology has been developed as a radiation diagnostic apparatus. Such planar radiation imaging apparatus includes an indirect conversion type, which converts X-rays to visible light with a phosphor for detection with photodiodes arranged in a matrix, and a direct conversion type, which directly converts X-rays to electric charge by the photoelectric effect using amorphous selenium for detection.

The radiation diagnostic apparatus requires a high contrast resolution for doctor's diagnosis. However, there is a several hundred times difference between dosages of X-ray used for fluoroscopy and those used for radiography. Therefore, the bit range of an AD converter cannot be effectively utilized. U.S. Pat. No. 6,163,029 has proposed an improvement measure.

SUMMARY OF THE INVENTION

In U.S. Pat. No. 6,163,029, the integration constant and the gain of a first stage integral amplifier are changed according to the X-ray irradiation to adjust the signal to the input range of the AD converter in order to make effective use of the bit range of the AD converter. However, noise prior to the first stage integral amplifier, such as shot noise, TFT noise, 1/f noise of the first stage integral amplifier, etc., becomes dominant in radiography, such as fluoroscopy, that is performed over a long time period with low dosage and in which the gain of the first stage integral amplifier is set high. Therefore, S/N does not change even if the gain is changed according to the dosage of irradiated X-rays. As a result, it is not possible with that arrangement to obtain a sufficiently high contrast resolution.

An object of the present invention is to provide a radiation imaging apparatus, a drive method and a program of the radiation imaging apparatus capable of improving S/N ratio of a derived image.

A radiation imaging apparatus of the present invention includes: a conversion unit including a plurality of pixels arranged two dimensionally, wherein each of the pixels includes a conversion element for converting an incident radiation into an electric charge and a switching element for transferring an electric signal based on the electric charge; a drive circuit unit for outputting, to the switching element, a drive signal having a voltage for turning on the switching element; a read-out circuit unit for reading out the electric signal from the pixel; a calculating unit for calculating S/N ratio of the electric signal read out by the read-out circuit unit; and a determination unit capable of changing the voltage of the drive signal output from the drive circuit unit according to the S/N ratio calculated.

A driving method of a radiation imaging apparatus of the present invention includes: a conversion unit including a plurality of pixels arranged two dimensionally, wherein each of the pixels includes a conversion element for converting an incident radiation into an electric charge and a switching element for transferring an electric signal based on the electric charge; a drive circuit unit for outputting, to the switching element, a drive signal having a voltage for turning on the switching element; and a read-out circuit unit for reading out the electric signal from the pixel, the method including; a calculating step of calculating S/N ratio of the electric signal read out by the read-out circuit unit; and determining step of determining the voltage of the drive signal output from the drive circuit unit according to the S/N ratio calculated.

A storage medium for storing a program of the present invention operates a computer to execute steps of driving a radiation imaging apparatus including: a conversion unit including a plurality of pixels arranged two dimensionally, wherein each of the pixels includes a conversion element for converting an incident radiation into an electric charge and a switching element for transferring an electric signal based on the electric charge; a drive circuit unit for outputting, to the switching element, a drive signal having a voltage for turning on the switching element; and a read-out circuit unit for reading out the electric signal from the pixel, the steps including; a calculating step of calculating S/N ratio of the electric signal read out by the read-out circuit unit; and a determining step of determining the voltage of the drive signal output from the drive circuit unit according to the S/N ratio calculated.

In the present invention, the S/N ratio of the electrical signal read-out by the read out circuit unit is calculated to set an appropriate voltage of the drive signal. As a result, the radiation imaging apparatus and the drive method of the radiation imaging apparatus can reduce noise of the switching element and achieve radiography with a high S/N ratio.

Further features of the present invention will become apparent from the following description of exemplary embodiments with reference to the attached drawings.

BRIEF DESCRIPTION OF THE DRAWINGS

FIG. 11 is a timing chart of the radiation imaging apparatus in a third embodiment of the present invention.

DESCRIPTION OF THE PREFERRED EMBODIMENTS

First Embodiment

Figure 1:
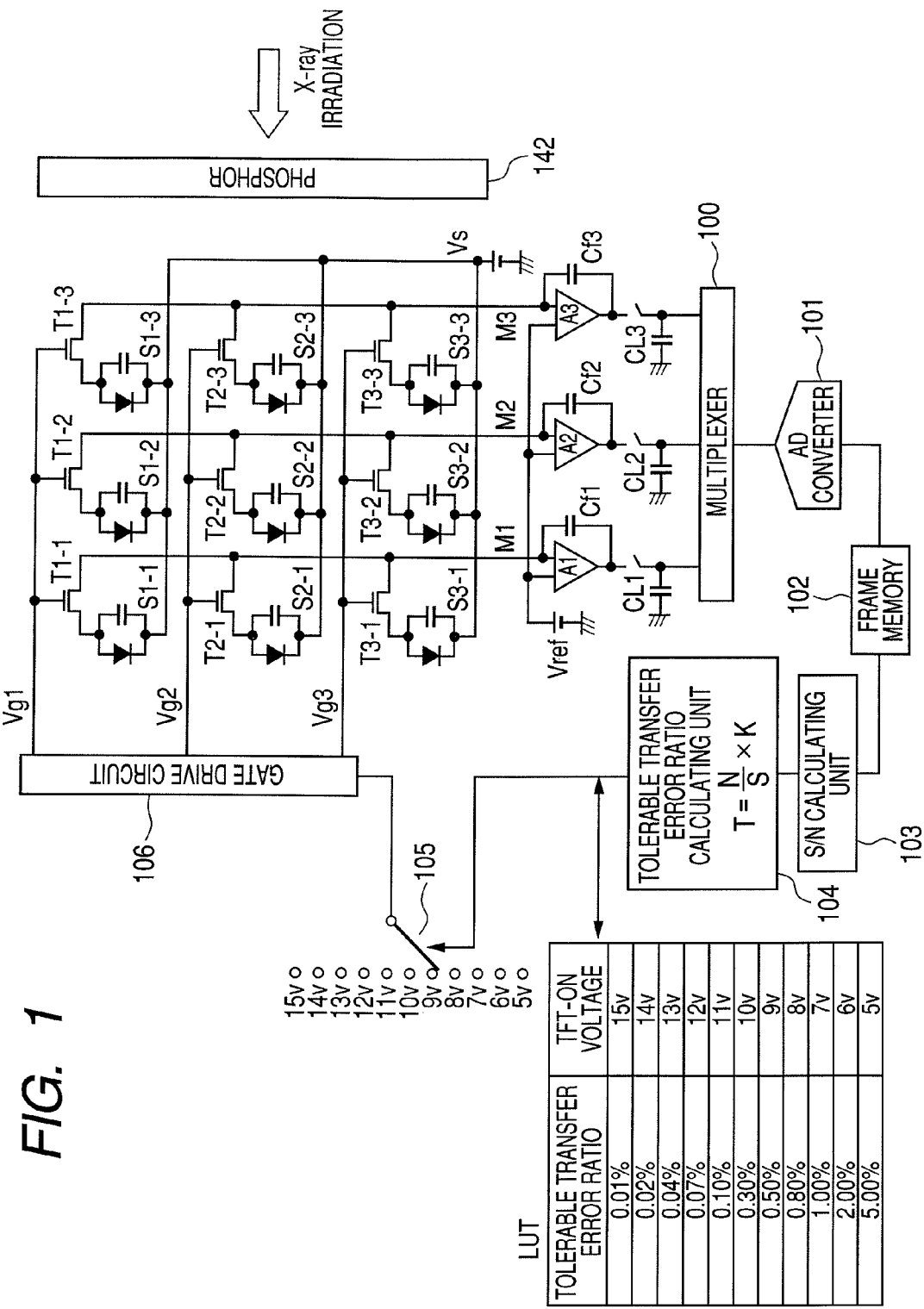
FIG. 1 is a conceptual block diagram of a radiation imaging apparatus in a first embodiment of the present invention.

FIG. 1 is a schematic block diagram of a radiation imaging apparatus in a first embodiment of the present invention. A moving image photographing mode for fluoroscopy and a still image photographing mode for radiography can be freely selected in the radiation imaging apparatus.

In FIG. 1, reference numeral 142 denotes a phosphor, S1-1 to S3-3 denote photoelectric conversion elements, T1-1 to T3-3 denote switching elements (hereinafter "TFT"), Vg1 to Vg3 denote gate wirings for turning on/off the TFT, and M1 to M3 denote signal wirings. The photoelectric conversion elements are represented by photodiodes and applied with reverse bias. Thus, cathode electrodes of the photodiodes are positively biased. A bias wiring Vs is a common wiring and is connected to a reference power supply circuit. Examples of the photoelectric conversion elements include MIS-type and PIN-type thin film photoelectric conversion elements formed from hydrogenated amorphous silicon films and PN photodiodes formed from single-crystal silicon. The photoelectric conversion elements may be amorphous selenium, gallium arsenide, mercuric iodide, lead iodide or cadmium telluride for directly converting X-rays to an electric signal. Thin film transistors formed from amorphous silicon, polysilicon or single-crystal silicon as well as known MOS transistors can be used as the switching elements. Transparent glass having less alkaline components is mainly used as a material of an insulating substrate.

A gate drive circuit 106 applies a pulse to the gate wirings Vg1 to Vg3 to drive and control the switching elements T1-1 to T3-3. First stage integral amplifiers A1 to A3 read out an electric charge generated in the photoelectric conversion elements. Reference numerals Cf1 to Cf3 denote integral capacities of the first stage integral amplifiers. Reference character Vref denotes a reference power supply of the first stage integral amplifiers. Sample and hold circuits CL1 to CL3 sample signals. A multiplexer 100 sequentially changes and outputs the sampled and held signals. An AD converter 101 digitally converts an analog signal output from the multiplexer 100.

A drive method of the radiation imaging apparatus of FIG. 1 will now be described. X-rays are first irradiated to the radiation imaging apparatus, and a phosphor 142 converts the wavelength of the irradiated X-rays to form visible light. The photoelectric conversion elements S1-1 to S3-3 receive the resulting visible light, which is then converted to an electric charge and stored. The gate drive circuit 106 then drives the gate wiring Vg1 to turn on the switching elements T1-1 to T1-3 and transfers the electric charge stored in the photoelectric conversion elements S1-1 to S1-3 to the integral capacities Cf1 to Cf3 of the first stage integral amplifiers A1 to A3. The electric charge is converted to a voltage signal. The sample and hold circuits CL1 to CL3 then sample and hold the read out voltage signal, and the multiplexer 100 sequentially changes the voltage signal. The AD converter 101 digitally converts the analog signal, and the frame memory 102 saves the signal. The repetition of such a read-out operation with respect to the gate wirings Vg1 to Vg3 enables to obtain a two dimensional image of 3×3 pixels. Although a matrix of 3×3 pixels is illustrated herein for description, a large area sensor of more than 1000×1000 pixels is actually formed.

An S/N calculating unit 103 calculates the amount of noise and the amount of signal from image data saved in the frame memory 102. A tolerable transfer error calculating unit 104 calculates a tolerable transfer error ratio T based on the calculation result. A look up table LUT relates the tolerable transfer error ratio T and a TFT-ON voltage, and an analog switch 105 changes the voltage to a TFT-ON voltage determined from the LUT. The TFT-ON voltage is a gate voltage for turning on the switching elements (TFT) T1-1 to T3-3.

A method of setting the TFT-ON voltage by calculating the S/N will now be described with reference to FIGS. 1-8.

Figure 2:
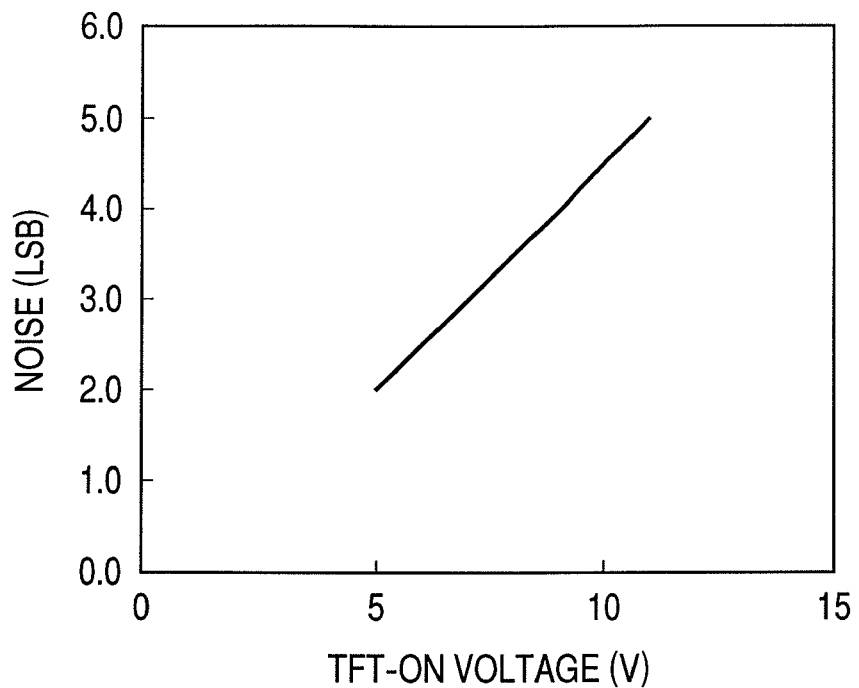
FIG. 2 is a graph of the relationship between a TFT-ON voltage and noise in the first embodiment of the present invention.

FIG. 2 is a graph plotting the TFT-ON voltage on the horizontal axis and the amount of noise on the vertical axis. The amount of noise increases as the TFT-ON voltage is raised. The noise caused by the TFT is generally called partition noise.

Figure 3:
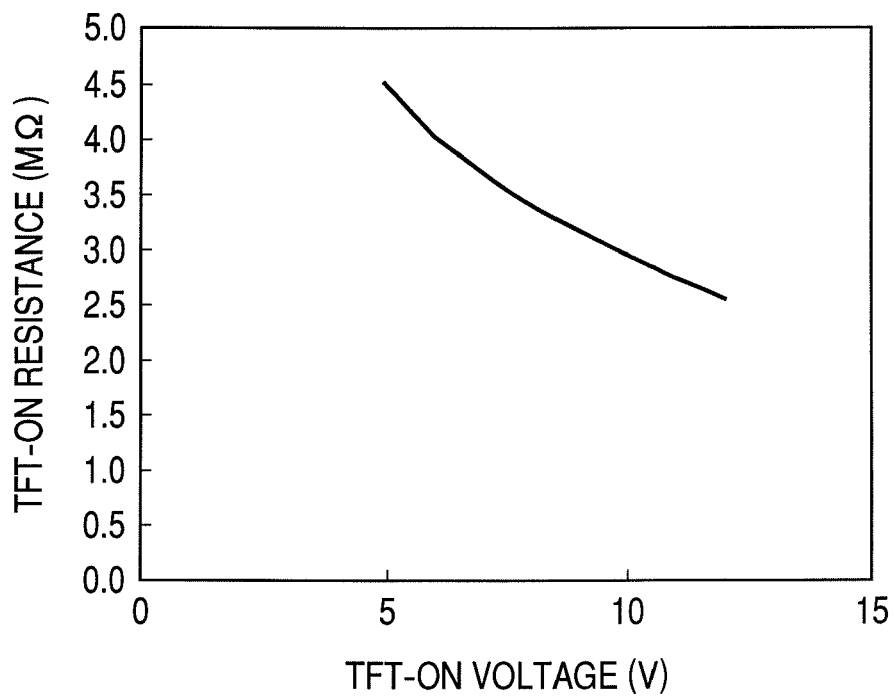
FIG. 3 is a graph of the relationship between the TFT-ON voltage and an ON resistance in the first embodiment of the present invention.

FIG. 3 plots the TFT-ON voltage and a TFT-ON resistance. According to the graph, the ON resistance decreases as the TFT-ON voltage is raised. The TFT is turned on for a predetermined time and the signal is transferred to the first stage integral amplifier to read out the electric signal stored in the photoelectric conversion element. The time required for the transfer is determined by the product of the capacity of the photoelectric conversion element and the TFT ON resistance. Therefore, according to the phenomenon of FIG. 2, the TFT-ON resistance increases when one tries to reduce the noise by lowering the TFT-ON voltage, and the time for transferring the signal from the photoelectric conversion element to the first stage integral amplifier needs to be long. However, when photographing is performed repeatedly such as in fluoroscopy, the transfer time cannot be made long because the frame rate needs to be high.

Figure 4:
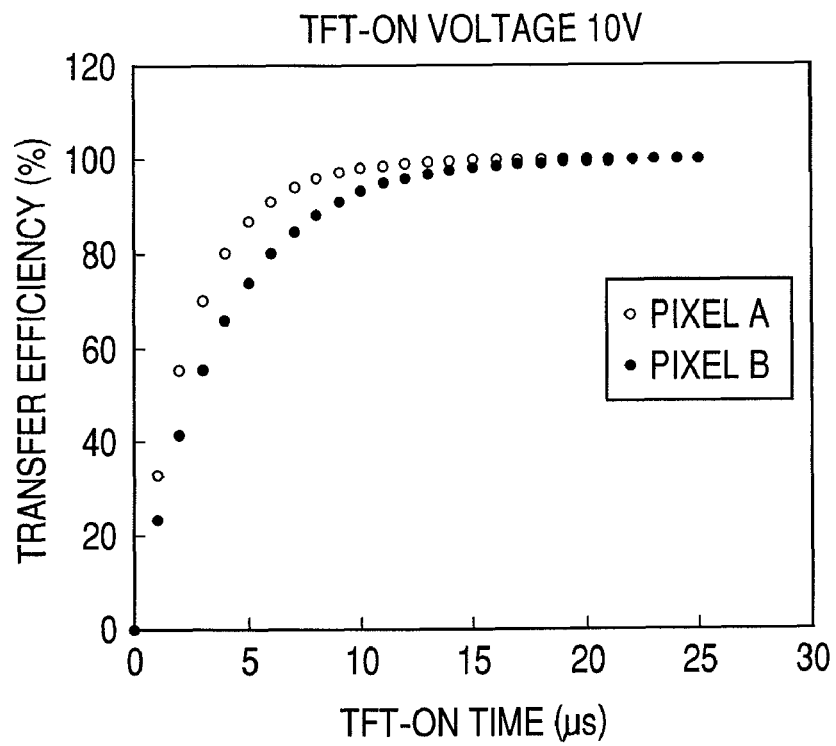
FIG. 4 is a graph of TFT-ON time and transfer efficiency when the TFT-ON voltage is 10 V in the first embodiment of the present invention.
Figure 5:
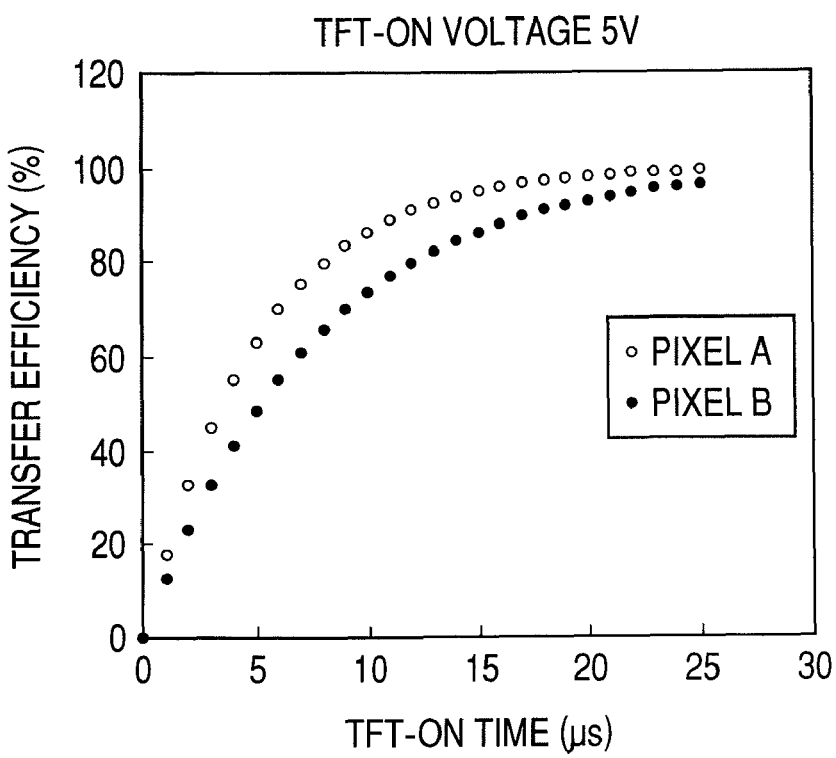
FIG. 5 is a graph of TFT-ON time and transfer efficiency when the TFT-ON voltage is 5 V in the first embodiment of the present invention.

FIGS. 4 and 5 illustrate the TFT-ON time (on time period of the switching element) on the horizontal axis and the transfer efficiency on the vertical axis. The transfer efficiency denotes the percentage of the electric charge stored in the photoelectric conversion element transferred to the integral capacity of the first stage integral amplifier. For example, 60% transfer efficiency denotes that 60% of the electric charge stored in the photoelectric conversion element is transferred to the first stage integral amplifier. The TFT-ON voltage is 10 V in FIG. 4, and 5 V in FIG. 5. The radiation imaging apparatus is arranged with a plurality of pixels in a matrix, and forming the pixels completely uniform in the plane is difficult because of variations that occur in manufacturing. A pixel A and a pixel B are here the pixel with the highest transfer efficiency and that with the lowest transfer efficiency among the plurality of pixels arranged in the matrix. According to FIG. 4, there is a 0.3% difference in the transfer efficiency of these pixels when the TFT-ON voltage is 10 V and the transfer time as the on time period of the switching element is 25 μs, with the transfer efficiency of pixel A being 99.9% and that of pixel B being 99.6%. According to FIG. 5, there is a 5% difference in the transfer efficiency when the TFT-ON voltage is 5 V and the transfer time is 25 μs, with the transfer efficiency of pixel A being 99.8% and that of pixel B being 94.8%. The difference is larger when the TFT-ON voltage is lowered. Although the noise can be reduced by lowering the TFT-ON voltage, a difference in the level appears on the image because this non-uniformity of the transfer efficiency occurs in the plane.

Figure 6:
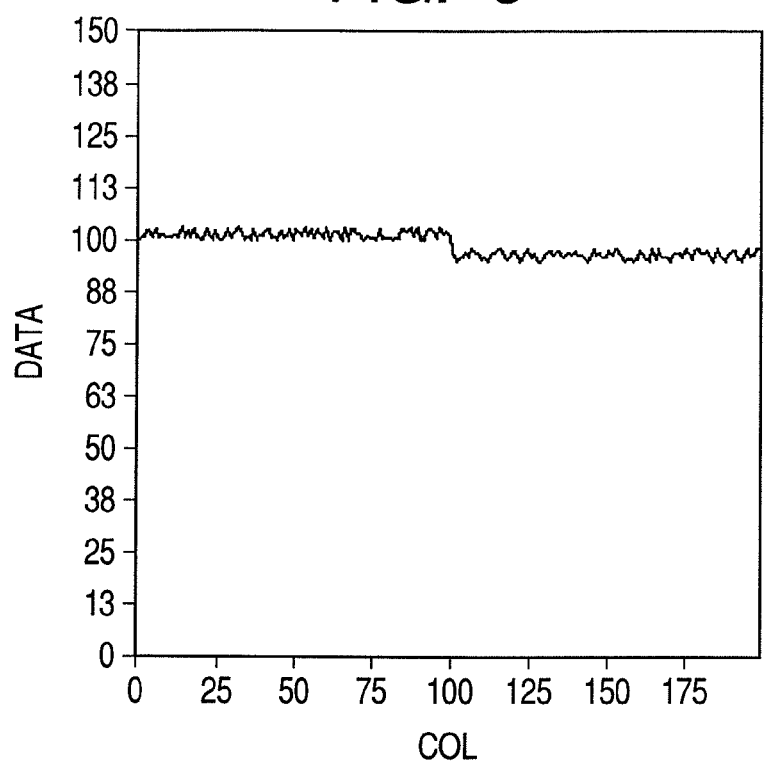
FIG. 6 is a graph of the relationship of the S/N ratio and certain artifact in the first embodiment of the present invention.
Figure 7:
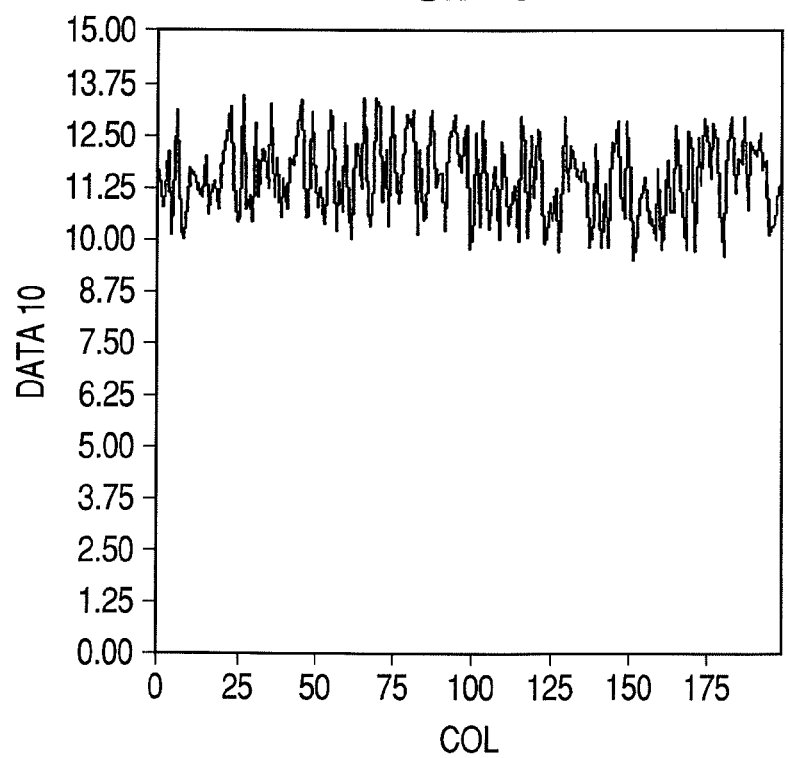
FIG. 7 is a graph of the relationship of the S/N ratio and the same artifact in the first embodiment of the present invention.

FIGS. 6 and 7 illustrate an influence, on the image, of the difference in the level due to the in-plane distribution of the transfer efficiency. The horizontal axis illustrates the position of the pixel while the vertical axis illustrates the output of the pixel. FIG. 6 is a graph when there is a 5% difference in the level in the image of S/N=100 where the noise is 1 when the signal is 100. FIG. 7 is a graph when there is a 5% difference in the level in the image of S/N=10 where the noise is 1 when the signal is 10. According to FIGS. 6 and 7, although the difference in the level can be recognized when S/N=100, the difference in the level cannot be recognized when S/N=10 even with the same 5% difference in the transfer efficiency.

In the present embodiment, the S/N of the image is calculated and the TFT-ON voltage is selected according to the S/N of the image. Therefore, an image with high S/N can be obtained in which there is less influence of the difference in the level due to the in-plane distribution of the transfer efficiency and the noise caused by the TFT is reduced.

Calculation of the S/N and a setting method of the TFT-ON voltage will now be described with reference to FIG. 1. An image of one frame output from the AD converter 101 is first saved in the frame memory 102. The S/N calculating unit 103 extracts the maximum value from the signals in the frame memory 102 and sets the maximum value as an amount of signal S. Although the maximum value is used herein, the average value may also be used. A target area may be set in the frame, and the maximum value or the average value of the amount of signal S of the set the target area may also be used. Furthermore, the maximum output value of the AD converter 101 or the average value of one frame may also be used without extracting the amount of signal. Although the S/N is calculated frame by frame to change the TFT-ON voltage of the next frame, the S/N can also be calculated line by line of the gate wiring to change the TFT-ON voltage of the gate wiring. The S/N calculating unit 103 calculates X-ray quantum noise $N_X=\sqrt{S}$ from the amount of signal S. The S/N calculating unit 103 also calculates an amount of noise $N_{ALL}$ with a formula illustrated in FIG. 8. The amount of noise $N_{ALL}$ is a value of the addition of system noises such as X-ray quantum noise $N_X$, shot noise $N_{SENS}$ of the photoelectric conversion element, TFT noise $N_{TFT}$, noise $N_{AMP}$ of the first stage integral amplifier and noise $N_{AD}$ of the AD converter. The system noise may be measured and fixed in advance because the system noise does not change through measurements and the amount of noise is always the same. The system noise may also be calculated in each measurement from an offset image photographed without irradiating X-rays.

The tolerable transfer error calculating unit 104 then multiplies the inverse of the S/N, in which the amount of noise $N_{ALL}$ is used as the amount of noise NT by an arbitrary factor K, thereby to obtain a value as the tolerable transfer error ratio T. The tolerable transfer error ratio T indicates how much influence, on the image, of the difference in the level due to the in-plane distribution of the TFT transfer efficiency can be tolerated. The factor K indicates a ratio between the S/N and the difference in the image level caused by the transfer error. It is preferable that the arbitrary factor K be equal to or less than 1. Assigning the arbitrary factor K a value that is greater than 1 is not preferable because the difference in the level of image due to the transfer variations of the TFT becomes larger than the noise. A TFT-ON voltage close to the tolerable transfer error ratio T is specified from the look up table LUT of the tolerable transfer error ratio T and the TFT-ON voltage. For example, if S=100, N=1 and K=0.1, the tolerable transfer error ratio is 0.1%. The TFT-ON voltage is set to 11 V and changed to a predetermined voltage by the analog switch 105. The gate drive circuit 106 supplies the voltage changed by the analog switch 105 to the gate wirings Vg1 to Vg3 of the TFT as a TFT-ON voltage. In this way, the noise caused by the TFT can be reduced by calculating the S/N from the image data and setting an optimal TFT-ON voltage. The radiation imaging apparatus also performs a gain compensation, to compensate for the gain variations of a read-out circuit. The gain compensation is performed by irradiating X-rays to take an image without the subject, and subtracting the image without the subject from the photographic image of the subject. In that case, the difference in the level caused by the TFT-ON voltage can be reduced by photographing a plurality of compensation images with different TFT-ON voltages in advance and using a photographic image of an object and a compensation image with the same TFT-ON voltages. In the present invention, the arbitrary factor K is a characteristic factor specific to the radiation imaging apparatus. The arbitrary factor K may be acquired and set at the time of shipping from factory or upon the installation of apparatus, or may be acquired and set such that periodical updates are possible.

An entire radiation imaging system including the radiation imaging apparatus will now be described with reference to FIG. 9. Reference numeral 301 denotes an X-ray room, 302 denotes an X-ray control room and 303 denotes an examination room. A system control unit 310 controls the overall operation of the present radiation imaging system.

Examples of an operator interface 311 include a touch panel on the display, a mouse, a keyboard, a joystick and a foot switch. The operator interface 311 can set imaging conditions (still image, moving image, tube voltage, tube current and irradiation time) imaging timing, image processing conditions, a subject ID and a processing method of an imported image. However, most of the information is transferred from a radiation information system (not shown) and does not have to be individually input. An important operation of an operator 305 is a checking operation of a photographed image. Thus, the operator 305 determines whether the angle is correct, the patient has not moved and the image processing is appropriate.

The system control unit 310 instructs the imaging conditions based on an instruction of the operator 305 or the radiation information system to an imaging control unit 214 that controls an X-ray imaging sequence and imports data. The imaging control unit 214 drives an X-ray generator 120 as a radiation source, a bed for imaging 130 and a radiation imaging apparatus 140 based on the instruction and imports image data. After transferring the image data to an image processing unit 10, the imaging control unit 214 applies image processing specified by the operator, displays the image data on a display 160, and at the same time, saves raw data applied with basic image processing of an offset correction, a white correction and a defect correction to an external storage 161.

Based on the instruction of the operator 305, the system control unit 310 further performs second image processing and restoration display, transfers and saves the image data in an apparatus on the network, displays the image data and prints the image data on a film.

The embodiment will be further described in sequence, following the flow of the signal. The X-ray generator 120 includes an X-ray tube 121 and an X-ray aperture 123. The X-ray tube 121 is driven by a high pressure source 124 controlled by an imaging control unit 214 and radiates an X-ray beam 125. The X-ray aperture 123 is driven by the imaging control unit 214 and adjusts the X-ray beam 125 so as not to irradiate unnecessary X-rays as the imaging area changes. The X-ray beam 125 is directed to an object 126 lying on the X-ray transmission bed for imaging 130. The bed for imaging 130 is driven based on an instruction of the imaging control unit 214. The X-ray beam 125 is transmitted through the object 126 and the bed for imaging 130 and then arrives at the radiation imaging apparatus 140.

The radiation imaging apparatus 140 includes a grid 141, a fluorescent screen 142, a photoelectric conversion substrate 8, an X-ray exposure monitor 144 and a drive/read-out circuit 145. The grid 141 reduces an influence of X-ray scattering that results from transmission through the object 126. The grid 141 is formed of an X-ray low absorption member and a high absorption member and has, for example, a stripe geometry of Al and Pb. The imaging control unit 214 instructs the grid 141 to vibrate during the X-ray irradiation so that moiré is not generated due to the relationship of a grid ratio between the photoelectric conversion substrate 8 and the grid 141.

X-rays with high energy excites a main ingredient of the phosphor in the fluorescent screen 142, and fluorescence in a visible region can be obtained from the recombination energy upon recombination. The fluorescence may be generated from a main ingredient such as $Gd_2O_2S$:Tb, $CaWO_4$ and $CdWO_4$, or may be generated from a luminescence center material activated in a main ingredient such as CsI:Tl and Zns:Ag.

The photoelectric conversion substrate 8 is arranged adjacent to the fluorescent screen 142. The photoelectric conversion substrate 8 converts photons into an electric signal. The X-ray exposure monitor 144 monitors the amount of transmitted X-rays. The X-ray exposure monitor 144 may directly detect the X-rays using a light receiving element made of crystal silicon or may detect light from the fluorescent screen 142. In this example, an amorphous silicon light receiving element formed as a film on the back side of the photoelectric conversion substrate 8 detects visible light (proportional to the amount of X-rays) transmitted through the photoelectric conversion substrate 8, and the information is transmitted to the imaging control unit 214. Based on the information, the imaging control unit 214 drives the high pressure source 124 to shut off or adjust the X-rays. The drive circuit 145 drives the photoelectric conversion substrate 8 under the control of the imaging control unit 214 to read out signals from the pixels.

The image signal from the radiation imaging apparatus 140 is transmitted from the X-ray room 301 to the image processing unit 10 of the X-ray control room 302. During the transfer, there is much noise in the X-ray room 301 caused by the generation of the X-rays, and the image data are not accurately transferred in some cases due to the noise. Therefore, the noise tolerance of the transfer path needs to be high. A transmission system having an error correction function can be employed, or a transfer path made of a twisted pair wire with shield or an optical fiber driven by a differential driver can be used. The image processing unit 10 changes the displayed data based on an instruction of the imaging control unit 214. The image processing unit 10 also performs a correction of image data (offset correction, white correction and defect correction), spatial filtering and a recursive process in real time. The image processing unit 10 can also perform a gradation process, a scattered radiation correction and various spatial frequency processes.

The processed image is displayed on the display 160 through a display adapter 151. The external storage 161 saves a basic image applied with only the real-time image processing as well as the data correction. A data saving apparatus with large capacity, high speed and high reliability can be used as the external storage 161. For example, a hard disk array such as a RAID can be used. The external storage 162 saves the image data stored in the external storage 161 based on an instruction of the operator. The external storage saves the image data after reconfiguring the image data to satisfy a predetermined standard (for example, IS&C). Examples of the external storage include a magneto optical disk 162 and a hard disk in a file server 170 on a LAN.

The present radiation imaging system can be connected to a LAN through a LAN board 163 and is configured to have data compatibility with an HIS (information system). A plurality of radiation imaging systems can be connected to the LAN. A monitor 174 that displays moving images and still images, the file server 170 that files the image data, an image printer 172 that outputs the image on a film and an image processing terminal 173 that performs complicated image processing or diagnostic support are connected to the LAN. The present radiation imaging system outputs the image data according to a predetermined protocol (for example, DICOM). The doctor can also perform real-time remote diagnosis during X-ray imaging by use of a monitor connected to the LAN.

Second Embodiment

In the first embodiment, the signal output from the AD converter 101 is saved in the frame memory 102, and the S/N ratio is calculated from the saved image data. In a second embodiment, the imaging control unit 214 controls the X-ray irradiation by the X-ray generator 120 and outputs the irradiating conditions of the X-rays to the S/N calculating unit 103. The S/N calculating unit 103 imports the irradiating conditions of the X-rays from the imaging control unit 214 and predicts the amount of signal S and the amount of noise N of the radiation imaging apparatus from the X-ray irradiating conditions. The tolerable transfer error calculating unit 104 and the analog switch 105 change the TFT-ON voltage as described above. The X-ray irradiating conditions include tube voltage, tube current, irradiation time, distance between the X-ray tube and the radiation imaging apparatus and subject information. The amount of signal and the amount of noise are predicted by photographing images in advance with different tube voltages and tube currents and by associating the images with output signals. The X-ray irradiating conditions may also include the S/N ratio of image desired by the operator (that is, the target value of the S/N ratio). The operator interface 311 inputs the target value of the S/N ratio desired by the operator to the imaging control unit 214 from outside the radiation imaging apparatus. The imaging control unit 214 provides the S/N ratio to the S/N calculating unit 103. A similar process may be performed by assuming and calculating the provided S/N ratio as the read-out S/N ratio. This makes it possible to change the TFT-ON voltage to satisfy the S/N ratio desired by the operator. As a result, an image with the S/N ratio desired by the operator can be derived.

Third Embodiment

FIG. 11 is a timing chart of the radiation imaging apparatus in a third embodiment of the present invention. Only the points different from the first embodiment will be described.

The radiation imaging apparatus irradiates X-rays and subtracts an offset frame for photographing a dark current component of the photoelectric conversion element from an X-ray frame for photographing the subject, thereby to form an image and perform an offset correction. Noise $N_{XF}$ of the X-ray frame and noise $N_{OF}$ of the offset frame are added, and the amount of noise of the image after the offset correction is $N_{ALL} = N_{XF}^2 + N_{OF}^2$. The amount of signal of the X-ray frame is greater than that of the offset frame because the X-ray is irradiated for the photoelectric conversion element to generate the electric charge. Therefore, the S/N of the X-ray frame is greater than that of the offset frame. The S/N after the offset correction is improved by changing the TFT-ON voltages of the X-ray frame and the offset frame and making the TFT-ON voltage of the offset frame small to lower the amount of noise of the offset frame. In FIG. 11, X-ray is irradiated based on an X-ray signal in the X-ray frame. The levels of the gate wirings Vg1 to Vg3 sequentially become high, and a signal after the AD conversion is output (AD OUT). In the offset frame, the gate wirings Vg1 to Vg3 are sequentially switched to high levels without irradiating the X-ray to read out the dark current component of the photoelectric conversion element and to perform a subtraction process based on the previously read out X-ray frame. The X-ray frame is photographed with 10 V TFT-ON voltage, and the offset frame is photographed with 5 V TFT-ON voltage. As a result, the noise of the offset frame can be reduced, and the amount of noise as a whole can be reduced.

Figures 8, 9:
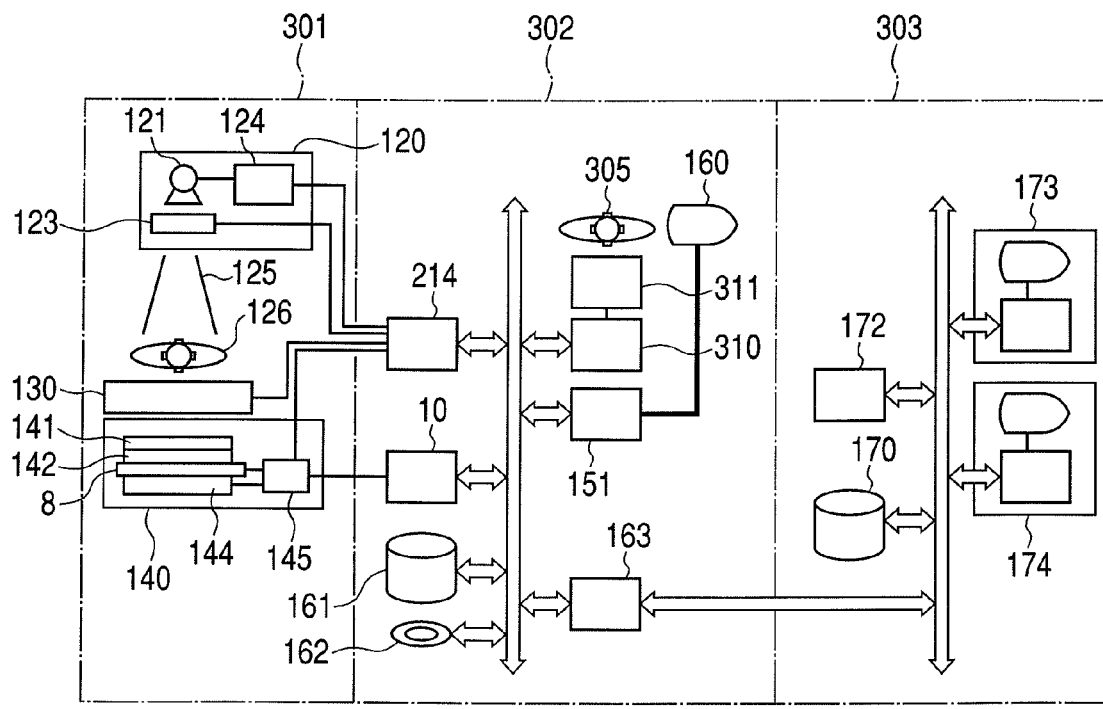
FIG. 8 illustrates a formula of noise in the first embodiment of the present invention.
FIG. 9 is a conceptual block diagram of a radiation imaging system in the first embodiment of the present invention.

In the first to third embodiments the imaging control unit (computer) 214 of FIG. 9 may execute a program to realize the processing step of the S/N calculating unit 103 and the tolerable transfer error calculating unit 104. The look up table LUT and the program are stored in the external storage 161. A unit for supplying a program to the computer can also be applied as an embodiment of the present invention. Examples of the unit include a computer-readable recording medium, such as a CD-ROM recorded with the program, and a transferring medium, such as the Internet for transferring the program. A computer program product such as a computer-readable recording medium recorded with the program can also be applied as an embodiment of the present invention. The program, the recording medium, the transferring medium and the computer program product are included in the scope of the present invention. A flexible disk, a hard disk, an optical disk, a magneto optical disk, a CD-ROM, a magnetic tape, a non-volatile memory card and a ROM can be used as the recording medium.

The first to third embodiments relate to a radiation imaging apparatus and particularly target a radiation imaging system used for diagnosis in hospitals and a radiation imaging apparatus used for industrial non-destructive inspection. The embodiments are suitably used for an imaging apparatus that utilizes radiation represented by visible light or X-rays. An example of the imaging apparatus includes a one-dimensional or two-dimensional imaging apparatus of the radiation imaging apparatus.

The radiation imaging apparatus of the first to third embodiments includes a conversion unit including a plurality of pixels arranged two dimensionally, wherein the pixels include a conversion elements for converting an incident radiation into an electric charge and switching elements T1-1 to T3-3 for transferring an electric signal based on the electric charge. The conversion element includes a phosphor 142 and photoelectric conversion elements S1-1 to S3-3. The drive circuit unit 106 is a drive circuit unit for outputting, to the switching elements T1-1 to T3-3, a drive signal having a voltage (TFT-ON voltage) for turning on the switching elements T1-1 to T3-3. The read-out circuit unit (including the integral amplifiers A1 to A3, the sample and hold circuits CL1 to CL3, the multiplexer 100 and the AD converter 101) is designed to read out the electric signal from the pixels. The calculating unit 103 is a calculating unit for calculating S/N ratio (signal to noise ratio) of the electric signal read out by the read-out circuit unit. The determination unit corresponds to the tolerable transfer error calculating unit 104, the look up table LUT and the analog switch 105, and is capable of determining and changing the voltage of the drive signal output from the drive circuit unit 106 according to the S/N ratio calculated. The tolerable transfer error calculating unit 104 performs a changing control step of determining, changing and controlling the voltage of the drive signal.

The determination unit is capable of changing the voltage of the drive signal according to the S/N ratio, a transfer efficiency of the switching elements T1-1 to T3-3 and an on time period of the switching elements T1-1 to T3-3.

Figure 10:
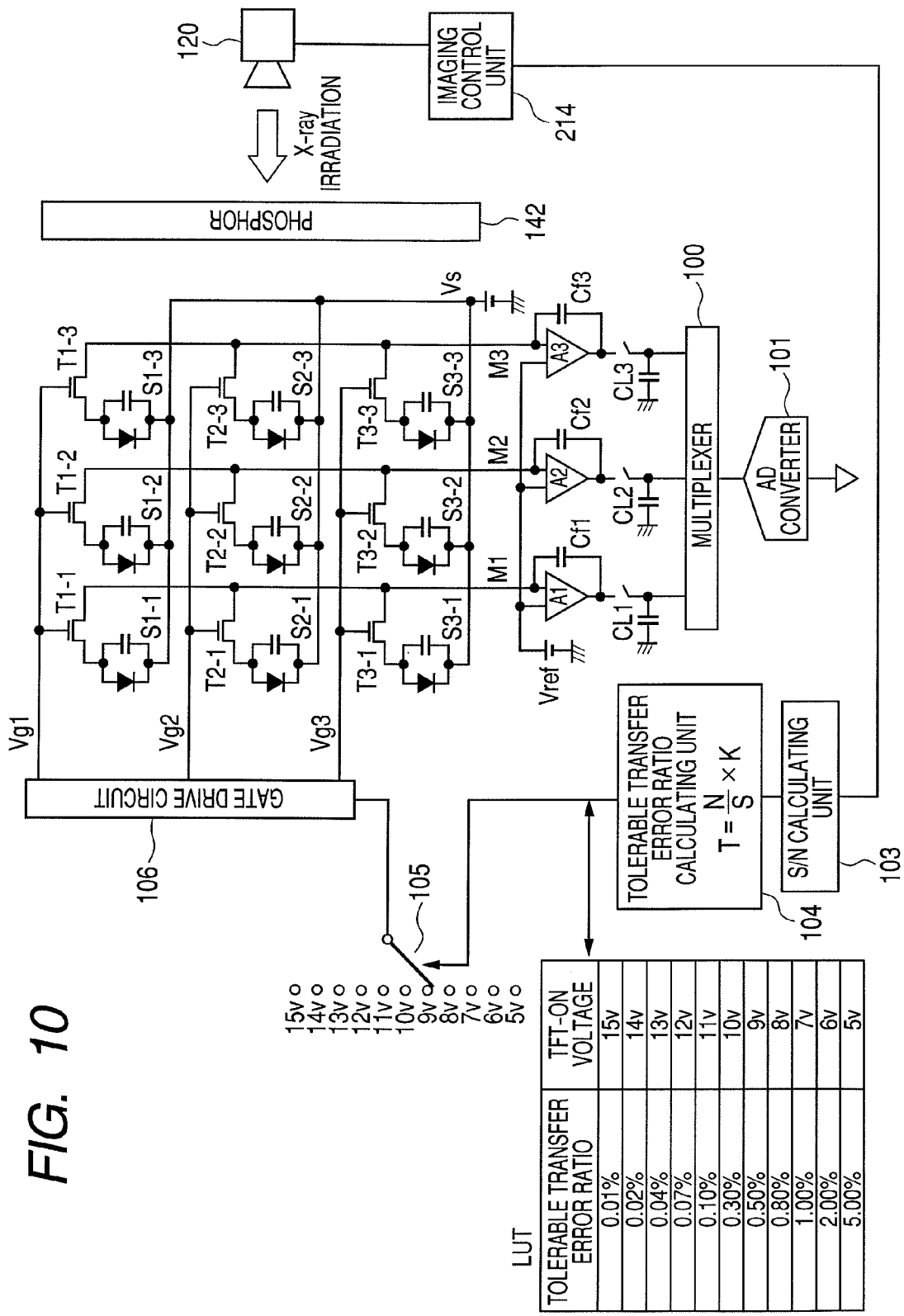
FIG. 10 is a conceptual block diagram of the radiation imaging apparatus in a second embodiment of the present invention.

In FIG. 10, the calculating unit 103 derives a radiation irradiating condition and calculates prospectively the S/N ratio based on the radiation irradiating condition derived. The calculating unit 103 further derives a target value of the S/N ratio and calculates the target value of the S/N ratio derived as the S/N ratio of the electric signal read out.

In FIG. 11, the determination unit is capable of changing the voltage of the drive signal such that the voltage of the drive signal for transferring an offset signal of the conversion element is made smaller than the voltage of the drive signal for transferring the electric signal based on the electric charge according to the radiation. The determination unit corresponds to the offset frame of FIG. 11 when transferring the offset signal of the conversion element and corresponds to the X-ray frame of FIG. 11 when transferring the electric signal based on the electric charge according to the radiation. The voltage of the drive signal corresponds to the TFT-ON voltage.

The conversion unit includes a plurality of the switching elements each for each row, drive wirings (gate wirings) Vg1 to Vg3 connected to the drive circuit unit, a plurality of the switching elements each for each column and signal wirings M1 to M3 connected to the read-out circuit unit.

The conversion element includes a wavelength converter (phosphor) 142 for converting the radiation into light and photoelectric conversion elements S1-1 to S3-3 for converting the converted light into an electric charge.

The photoelectric conversion elements S1-1 to S3-3 are photoelectric conversion elements, MIS type photoelectric conversion elements or PIN type photoelectric conversion elements formed from amorphous silicon on an insulating substrate.

The switching elements T1-1 to T3-3 are transistors or thin film transistors (TFT).

According to these embodiments, the S/N ratio of the electrical signal read out by the read-out circuit unit is calculated to set an appropriate voltage of the drive signal, thereby enabling to reduce noise of the switching element and achieve radiography with high S/N ratio.

These embodiments are intended to illustrate examples for implementing the present invention and should not be construed as limiting the technical scope of the present invention. The present invention can be implemented in various forms without departing from the spirit and essential characteristics of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-293522, filed Nov. 12, 2007, which is hereby incorporated by reference herein in its entirety.

What is claimed is:

1. A radiation imaging apparatus comprising:
   a conversion unit including a plurality of pixels arranged two dimensionally, wherein each of the pixels includes a conversion element for converting incident radiation into an electric charge and a switch element for transferring an electric signal based on the electric charge;
   a drive circuit unit for outputting, to the switching element, a drive signal having a voltage for turning on the switching element;

a read-out circuit unit for reading out the electric signal from the pixel;

a calculating unit for calculating an S/N ratio of the electric signal read out by the read-out circuit unit; and a determination unit for determining the voltage of the drive signal outputted from the drive circuit unit according to the S/N ratio calculated.

2. The radiation imaging apparatus according to claim 1, wherein the determination unit is capable of changing the voltage of the drive signal according to the S/N ratio, a transfer efficiency of the switching element and an on time period of the switching element.

3. The radiation imaging apparatus according to claim 1, wherein the calculating unit derives a radiation irradiating condition and calculates prospectively the S/N ratio based on the radiation irradiating condition derived.

4. The radiation imaging apparatus according to claim 1, wherein the calculating unit derives a target value of the S/N ratio and calculates the target value of the S/N ratio derived as the S/N ratio of the electric signal read out.

5. The radiation imaging apparatus according to claim 1, wherein the determination unit is capable of changing the voltage of the drive signal such that the voltage of the drive signal for transferring an offset signal of the conversion element is made smaller than the voltage of the drive signal for transferring the electric signal based on the electric charge according to the radiation.

6. The radiation imaging apparatus according to claim 1, wherein the conversion unit comprises a plurality of the switch elements each for each row, a drive wiring connected to the drive circuit unit, a plurality of the switch elements each for each column and a signal wiring connected to the read-out circuit unit.

7. The radiation imaging apparatus according to claim 1, wherein the conversion unit comprises a wavelength converter for converting the radiation into light and a photoelectric conversion element for converting the light into an electric charge.

8. The radiation imaging apparatus according to claim 7, wherein the photoelectric conversion element is an MIS-type photoelectric conversion element or a PIN-type photoelectric conversion element formed from amorphous silicon on an insulating substrate.

9. The radiation imaging apparatus according to claim 1, wherein the switching element is a thin film transistor.

10. A driving method of a radiation imaging apparatus comprising a conversion unit including a plurality of pixels arranged two dimensionally, wherein each of the pixels includes a conversion element for converting incident radiation into an electric charge and a switch element for transferring an electric signal based on the electric charge, a drive circuit unit for outputting, to the switching element, a drive signal having a voltage for turning on the switching element, and a read-out circuit unit for reading out the electric signal from the pixel, the method comprising:

a calculating step of calculating an S/N ratio of the electric signal read out by the read-out circuit unit; and a determining step of determining the voltage of the drive signal outputted from the drive circuit unit according to the S/N ratio calculated.

11. A storage medium storing a program for operating a computer to execute steps of driving a radiation imaging apparatus comprising a conversion unit including a plurality of pixels arranged two dimensionally, wherein each of the pixels includes a conversion element for converting incident radiation into an electric charge and a switch element for transferring an electric signal based on the electric charge, a drive circuit unit for outputting, to the switching element, a drive signal having a voltage for turning on the switching element, and a read-out circuit unit for reading out the electric signal from the pixel, the steps comprising:

a calculating step of calculating an S/N ratio of the electric signal read out by the read-out circuit unit; and a determining step of determining the voltage of the drive signal outputted from the drive circuit unit according to the S/N ratio calculated.

* * * * *